United States Patent [19]
Esener et al.

[11] Patent Number: 5,242,707
[45] Date of Patent: Sep. 7, 1993

[54] SYSTEM AND METHOD FOR PRODUCING ELECTRO-OPTIC COMPONENTS INTEGRABLE WITH SILICON-ON-SAPPHIRE CIRCUITS

[75] Inventors: Sadik C. Esener, Solana Beach; Sing H. Lee, Del Mar; Subramania Krishnakumar, La Jolla; Volkan H. Ozguz, Carlsbad; Chi Fan, San Diego, all of Calif.

[73] Assignee: Regents of the University of California, Alameda, Calif.

[21] Appl. No.: 632,033

[22] Filed: Dec. 21, 1990

[51] Int. Cl.$^5$ .............................................. B05D 5/12
[52] U.S. Cl. ................................... 427/126.3; 156/610; 204/192.11; 250/216; 427/162
[58] Field of Search ................... 427/38, 39, 53.1, 99, 427/162, 126.3; 250/216, 492.1; 204/192.12, 192.11; 156/610

[56] References Cited

U.S. PATENT DOCUMENTS

| | | | |
|---|---|---|---|
| 4,266,265 | 5/1981 | Maher | 427/79 X |
| 4,701,592 | 10/1987 | Cheung | 427/53.1 X |
| 5,043,049 | 8/1991 | Takenaka | 427/38 X |

Primary Examiner—Michael Lusigan
Attorney, Agent, or Firm—Fuess, Davidenas & Meadows

[57] ABSTRACT

A system and method are disclosed for producing electro-optic components with transparent, ferroelectric PLZT (perovskite) film characteristics, without lead diffusion. In particular, the fabrication of PLZT-on-sapphire electro-optic components for devices such as spatial light modulators, integrated infrared detectors, and optoelectronic integrated circuits is disclosed, permitting integration of such devices with semiconductor devices having the same substrate, such as silicon-on-sapphire circuits. The system comprises a PLZT film deposition apparatus, a silicon dioxide deposition apparatus, an annealing apparatus, and an optional plasma etching apparatus. During film deposition, material from a PLZT target (source) of suitable (9/65/35) composition is deposited on the substrate and is epitaxially grown on the R-plane (1102) of the substrate, forming a non-ferroelectric, pyrochloric film. The substrate and film are then placed in a silicon dioxide ($SiO_2$) deposition chamber where $SiO_2$ is deposited as an insulating layer covering (capping) the film. The substrate, with film and $SiO_2$ layer, is then placed in an annealing apparatus, at a selected temperature above 550° C. for a selected period of time, to transform the non-ferroelectric, pyrochloric film into a ferroelectric, perovskite film of (9/65/35) composition. The $SiO_2$ layer may then be removed by conventional etching.

16 Claims, 8 Drawing Sheets

SYSTEM AND METHOD FOR PRODUCING ELECTRO-OPTIC COMPONENTS INTEGRABLE WITH SILICON-ON-SAPPHIRE CIRCUITS

This invention was made with Government support under Grant (or Contract) Nos. N66001-86-C-0265 and N66001-87-C-0136, both awarded by DARPA.

BACKGROUND OF THE INVENTION

This invention relates to electro-optic devices such as spatial light modulators, integrated infrared detectors, and optoelectronic integrated circuits generally, and particularly to the fabrication of PLZT-on-sapphire electro-optic components for such devices, permitting integration of the electro-optic devices with semiconductor devices having the same substrate, such as silicon-on-sapphire circuits.

Numerous reports have been published regarding the deposition of PLT and PLZT film on C-plane (1010) sapphire substrates and other substrates by r-f magnetron sputtering. One report is the article entitled "Two-Dimensional Silicon/PLZT Spatial Light Modulators: Design Considerations and Technology," by S. H. Lee et al., OPTICAL ENGINEERING, Vol. 25 (No. 2), page 250 (Feb. 1986). Other reports include: "PLZT Thin Film Waveguides," by T. Kawaguchi et al., APPLIED OPTICS 23(13), 2187 (July 1984); "High Speed PLZT Optical Switches," by O. Yamazaki et al., TECHNICAL DIGEST ON INTEGRATED AND GUIDED WAVE OPTICS, Paper TuA6, OSA (1984); "Ferroelectric $(Pb,La)(Zr,Ti)O_3$ Epitaxial Thin Films on Sapphire Grown By R-F Planar Magnetron Sputtering," by H. Adachi et al., JOURNAL OF APPLIED PHYSICS 60(2), (Jul. 15, 1986); "Dielectric Properties of PLZT Epitaxial Thin Films," by H. Adachi et al., Proceedings Of The 4th Meeting on Ferroelectric Materials And Their Applications, Kyoto, 1983, JAPANESE JOURNAL OF APPLIED PHYSICS VOL. 22 (1983), Supplement 22-2,pp. 11–13; "Electric-Optic Effects Of $(Pb,La)(Zr,Ti)O_3$ Thin Films Prepared By R-F Planar Magnetron Sputtering," by H. Adachi et al., APPLIED PHYSICS LETTERS, 42 (10), (May 15, 1983); "Preparation and Properties of Ferroelectric PLZT Thin Films by R-F Sputtering," by M. Ishida et al., JOURNAL OF APPLIED PHYSICS 48,951 (1977); "Epitaxial Growth of Ferroelectric PLZT Thin Films and Their Optical Properties," by M. Okuyama et al., APPLIED PHYSICS 21,339 (1980).

For proper operation of electro-optic devices like those mentioned above, the PLZT film should be transparent and ferroelectric (i.e., attain a perovskite phase and exhibit a strong electro-optic effect).

PLZT exists in two structural forms: perovskite phase and a metastable pyrochloric phase. The perovskite phase (represented by $ABO_3$) is ferroelectric, whereas the pyrochloric phase (represented by $A_2B_2O_7$) is paraelectric. Within the family of PLZT compositions, the perovskite PLZT (9/65/35) is known to exhibit the largest quadratic electro-optic effect.

The inclusion of Zirconate (Zr) in the composition tends to reduce the transparency of the film. Also, the deposition of the film on a substrate at a temperature below 550° C. tends to reduce the electro-optic effect. When the film is deposited at an elevated temperature (e.g., above 550° C.) on the substrate, and the substrate is maintained at the elevated temperature, the film tends to exhibit the required transparency.

When the temperature of the substrate is raised to above 550° C., however, this satisfies the transparency requirement but causes diffusion of lead outward from the film, leading to lead deficiency in the deposited film, unwanted adulteration of the substrate, and reduced electro-optic effect.

What is needed and would be useful, therefore, is a system and method that could produce electro-optic components with transparent, ferroelectric film characteristics, without lead diffusion.

SUMMARY OF THE INVENTION

Accordingly, a system and method are provided that can produce electro-optic components with transparent, ferroelectric PLZT (perovskite) film characteristics without lead diffusion.

The system comprises a PLZT film deposition apparatus, a silicon dioxide deposition apparatus, an annealing apparatus, and an optional plasma etching apparatus. The PLZT film deposition apparatus includes a vacuum chamber, an ion gun for providing argon (Ar) ions, a triode Magnetron r-f sputterer, a PLZT target or source of suitable composition (e.g., a (9/65/35) composition powder), an R-plane (1102) sapphire substrate, a movable platform on which the substrate may be placed for movement therewith, a group of heating elements positioned proximate to the platform for heating the substrate and providing a deposition temperature in the range 300° C. to 700° C. (The temperature is selected so as to minimize out-diffusion of lead from the film during deposition.)

During film deposition, material from the target (source) is deposited on the substrate and is epitaxially grown on the R-plane of the substrate, forming a non-ferroelectric, pyrochloric film. The substrate and film are then placed in a silicon dioxide ($SiO_2$) deposition chamber where $SiO_2$ is deposited as an insulating layer covering (capping) the film. This is done to control lead diffusion during the next processing step. The substrate, with film and $SiO_2$ layer thereon, is then placed in an annealing apparatus (furnace/oven) at a temperature above 550° C. for a selected period of time (e.g., 30 minutes) to transform the non-ferroelectric, pyrochloric film into a ferroelectric, perovskite film of (9/65/35) composition. The $SiO_2$ is then removed by conventional plasma (CF4) etching.

DESCRIPTION OF THE PREFERRED EMBODIMENT

Figure 1:
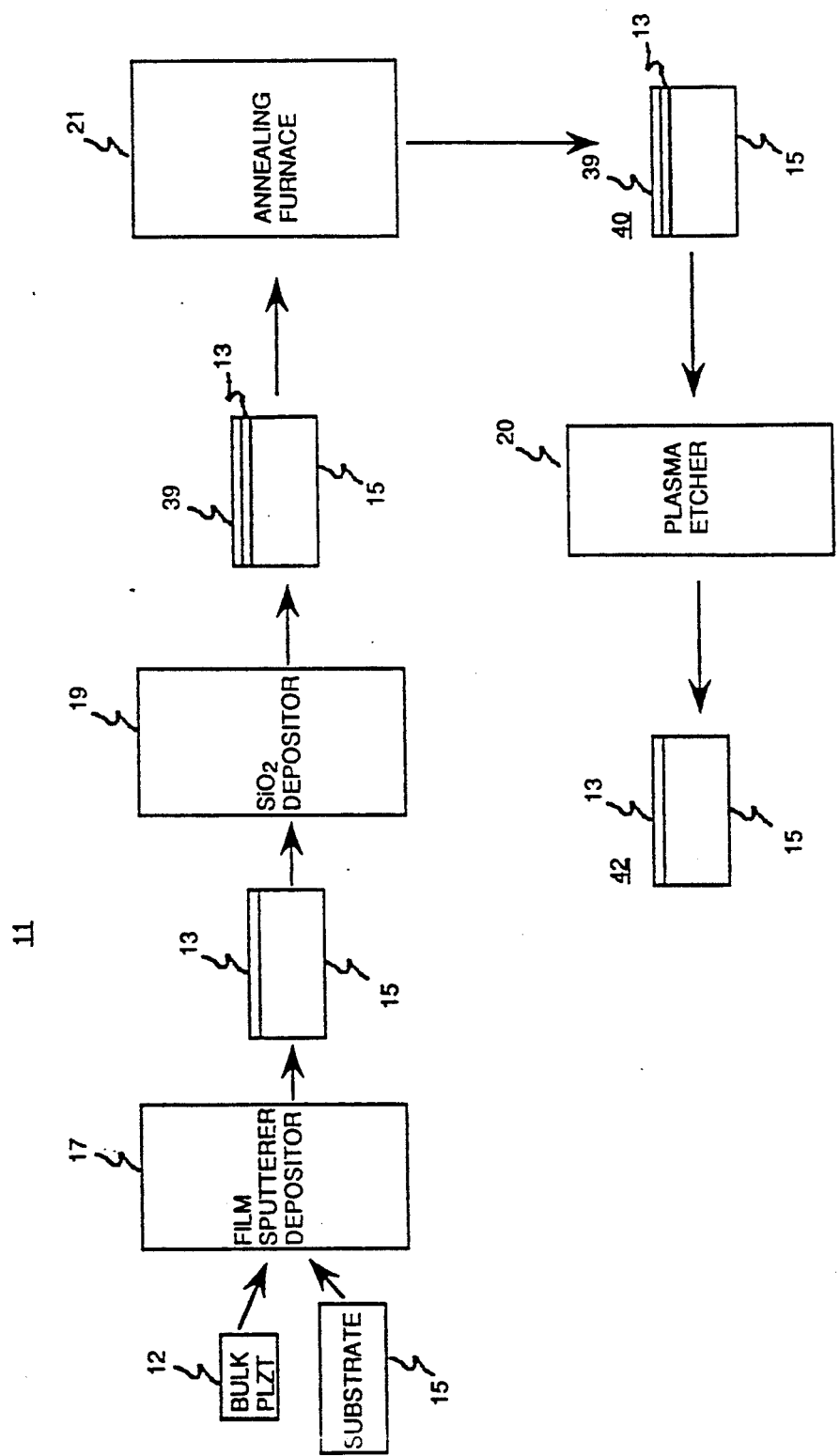
FIG. 1 is a block diagram showing the system and method employed in practicing the present invention; also shown are components produced by the system, including a first component having a transparent, ferroelectric, perovskite PLZT film of (9/65/35) composition epitaxially deposited on an R-plane (1102) sapphire substrate, a second component having an $SiO_2$ layer deposited on a pyrochloric PLZT film deposited on an R-plane sapphire substrate, and a third component having an $SiO_2$ layer deposited on a perovskite PLZT film deposited on an R-plane sapphire substrate.
Figure 2A:
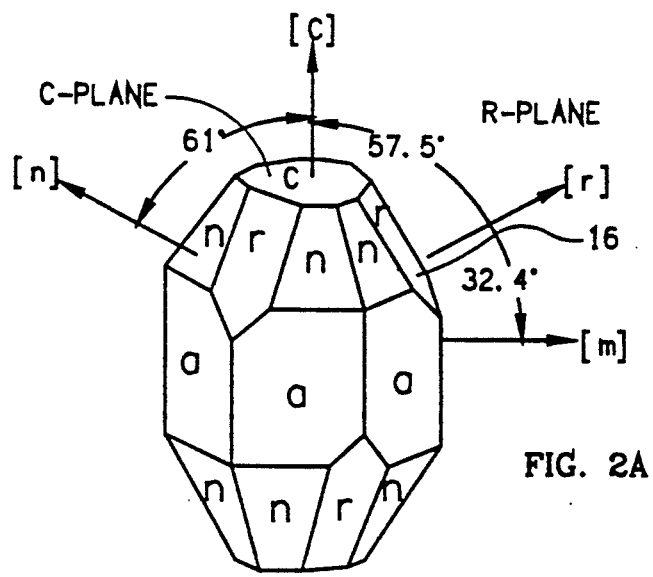
FIGS. 2A and 2B are perspective graphic illustrations of the R-plane of FIG. 1.
Figure 2B:
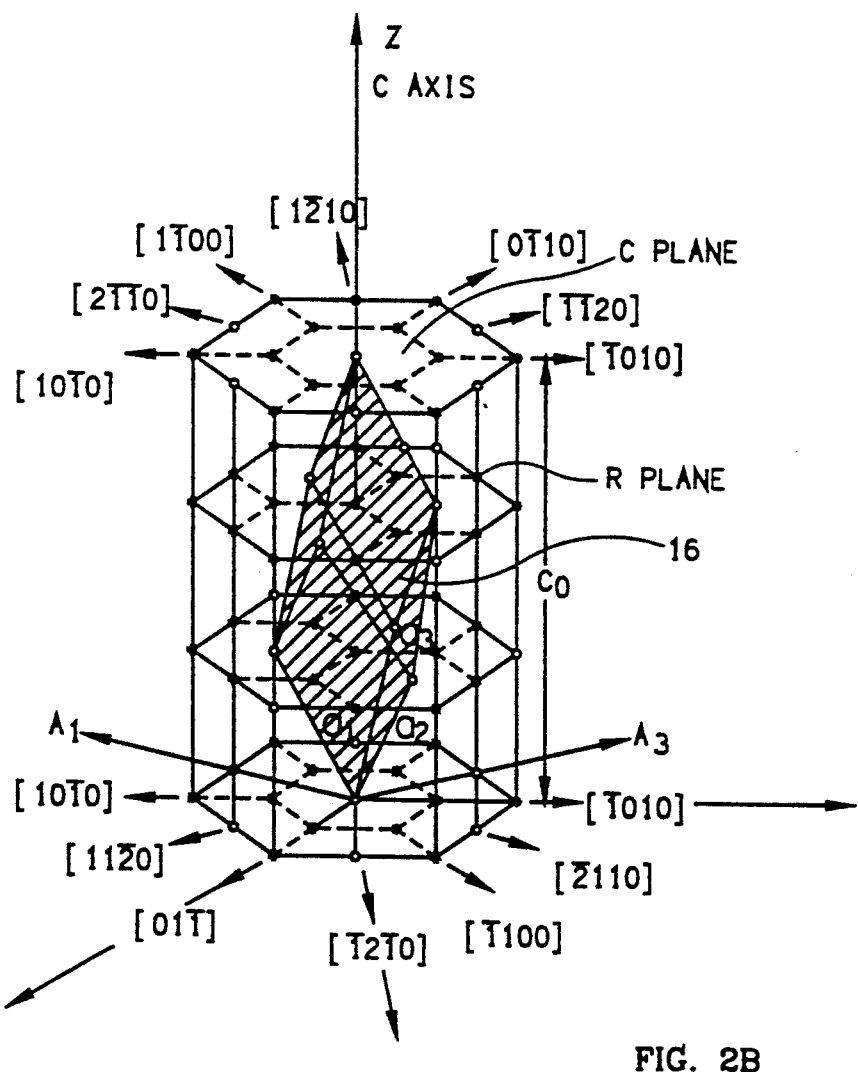

FIG. 1 shows a system 11 of the present invention for producing a perovskite phase PLZT-on-sapphire component 40, 42. The component is produced first by depositing PLZT film 13 of (9/65/35) composition, in pyrochloric phase, onto an R-plane sapphire substrate 15, then depositing $SiO_2$ and annealing the component to transform the film to perovskite phase. FIGS. 2A and 2B depict an R-plane (1102) sapphire configuration. The system (FIG. 1) comprises a film sputter-deposition apparatus 17, a silicon dioxide ($SiO_2$) deposition apparatus 19, an annealing apparatus (furnace/oven) 21, and an optional plasma etching apparatus 20.

Figure 3:
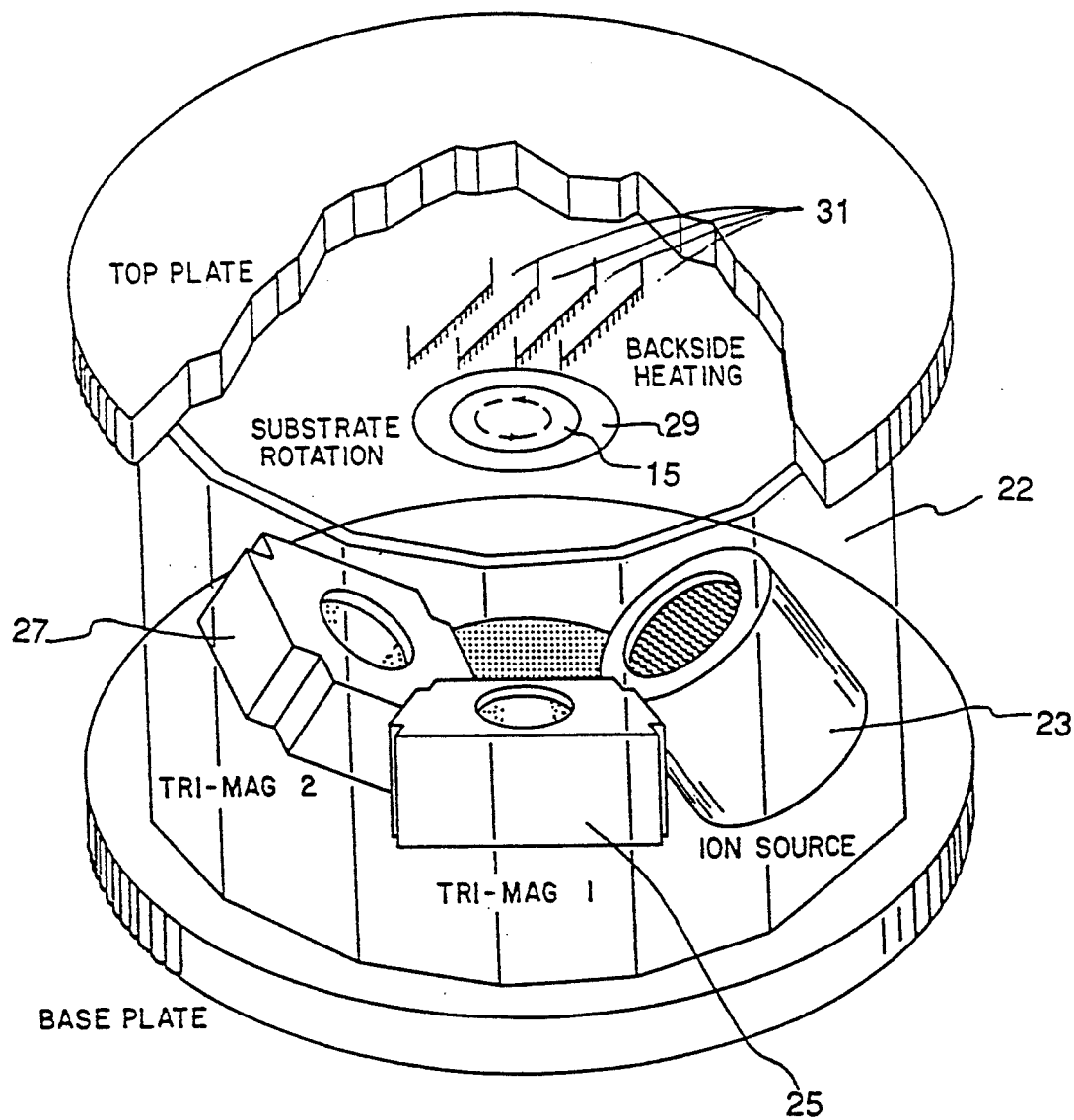
FIG. 3 is a cut-away graphic illustration of a film deposition apparatus of the system of FIG. 1.

As shown in FIG. 3, apparatus 17 is an ion-assisted triode Magnetron sputter deposition unit of a type that is commercially available from CHA Industries Corporation of Menlo Park, California. The apparatus 17 includes a vacuum chamber 22, an ion gun 23 for producing low-energy argon (Ar) ions, a triode Magnetron R-F sputterer with target (first source) 25, an optional sputter and second source 27, an R-plane (1102) sapphire substrate 15, a movable platform 29 on which the substrate is placed for planetary motion therewith, and a group (e.g., four) of heating elements 31 positioned proximate to the platform for heating the substrate to a temperature (e.g., 500° C.) in the range 300° C. to 700° C.

As an optional step prior to film deposition, the sapphire substrate is epitaxially polished on the front face (i.e., the face of film growth) and optically polished on the back face, then mounted on platform 29. The first source 25 includes a cold-pressed PLZT (9/65/35) powdered target, and the second source 27 (in the optional two-source configuration) has a bulk lead target used to achieve compensation for lead diffusion (as explained below) as film is deposited (grown) on the R-plane.

The target composition in the single-source configuration is selected so that the right stoichiometry of the deposited film is obtained at temperatures of, for example, 500° C. The composition ($C_t$) of the single target is, for 150 g PLZT: $Pb_3O_4$ 29.1 g, $PbZrO_3$ 102.1 g, $La_2O_3$ 6.8 g, TiO 2.7 g and $TiO_2$ 9.3 g. The targets were cold pressed, sintered at 850° C., powered and cold pressed again under 15 tons of pressure to a thickness of 0.25 inches.

The apparatus 17 operates at low chamber pressures (typically <1 Pascal (Pa)), which is an order of magnitude less than those of conventional planar magnetron sputtering apparatus. The deposition of film at a lower chamber pressure (e.g., 0.5 Pa) enables epitaxial growth at a lower substrate temperature (e.g., <550° C.), and yields smoother surfaces and lower optical propagation losses. (Refer, for example, to the above-mentioned Adachi references.) Further, the triode magnetron source 25 has a tendency to confine the plasma, produced by operation of gun 23, closer to the target, which leaves the film relatively unaffected by the rapidly changing dynamics of the plasma.

The substrate 15 is mounted on a rotating molybdenum backing plate 29 using molten indium (not shown), and is heated on the back side by radiation from a plurality (e.g., four) of halogen lamps 31. The substrate temperature is monitored using a Chromel-Alumel thermocouple (not shown) attached to substrate holder 29. In the single-source configuration, at a level of 150 watts of R-F power on the PLZT target(s), the substrate temperature (deposition temperature) is maintained at 500° C. In the dual-source configuration, the substrate or deposition temperature is maintained at 450° C. at a level of 160 watts on the 9/65/35 PLZT target, and 20 watts on the lead target.

The sputtering (deposition) conditions used in fabrication of the component are summarized in Table I.

TABLE I

| SPUTTER DEPOSITION CONDITIONS | | | |
|---|---|---|---|
| Target Conditions | Environmental Conditions | Source 1 | Source 2 |
| Target Diameter | — | 0.05 m | 0.125 m |
| Target to Substrate Spacing | — | 0.25 m | 0.25 m |
| R-F Power | — | 100–160 watts | 20–100 watts |
| Sputtering Gas | Argon | — | — |
| Chamber Pressure | 0.5 Pa | — | — |
| Substrate Temperature | 400–600° C. | — | — |
| Growth Rate | 2–3 nm/min | — | — |

A lead-enriched target (source) is used to compensate for out-diffusion of lead during film deposition. For example, an enriched target having the composition $C_t$ was used.

Figure 5A:
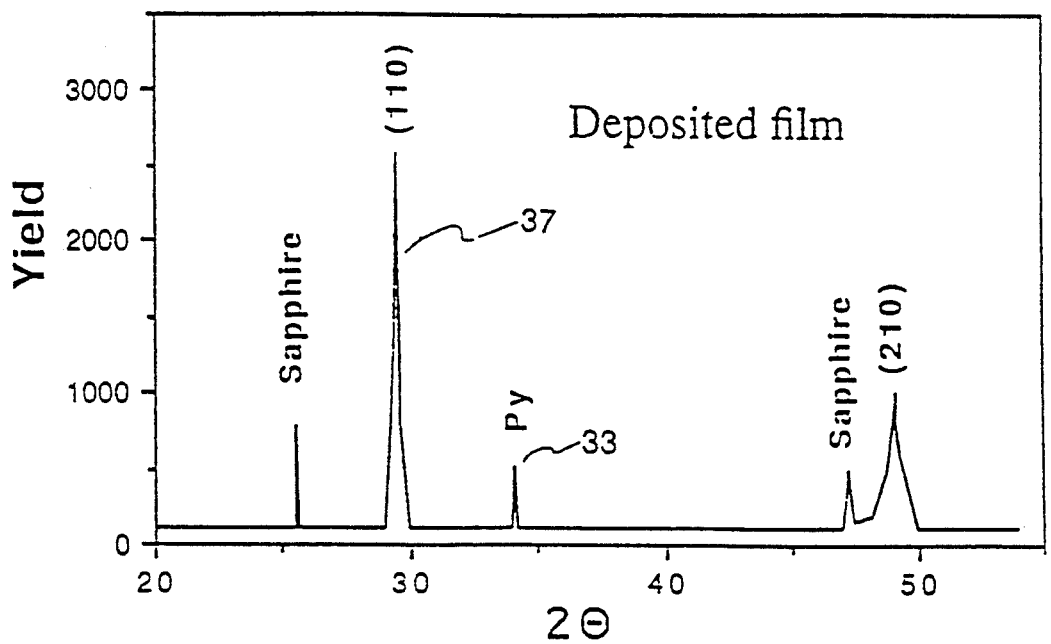
FIGS. 5A and 5B are diagrammatic illustrations of x-ray diffraction spectra corresponding to pyrochloric and perovskite phases, respectively, of PLZT film deposited by the system and method of FIG. 1.

The deposited film 13 is pyrochloric in phase, as evidenced by the pyrochloric peak 33 shown in the x-ray diffraction spectrum of FIG. 5A.

After deposition and prior to annealing, a silicon-dioxide ($SiO_2$) layer 39 (FIG. 1), for example, 200 nm thick, is deposited on the pyrochloric film 13 by conventional method using plasma-enhanced chemical vapor deposition (PECVD) apparatus 19. This is done to control or otherwise impede the out-diffusion of lead from the film that may occur during annealing. With the deposition of $SiO_2$, a component is formed ready for annealing.

Figure 4:
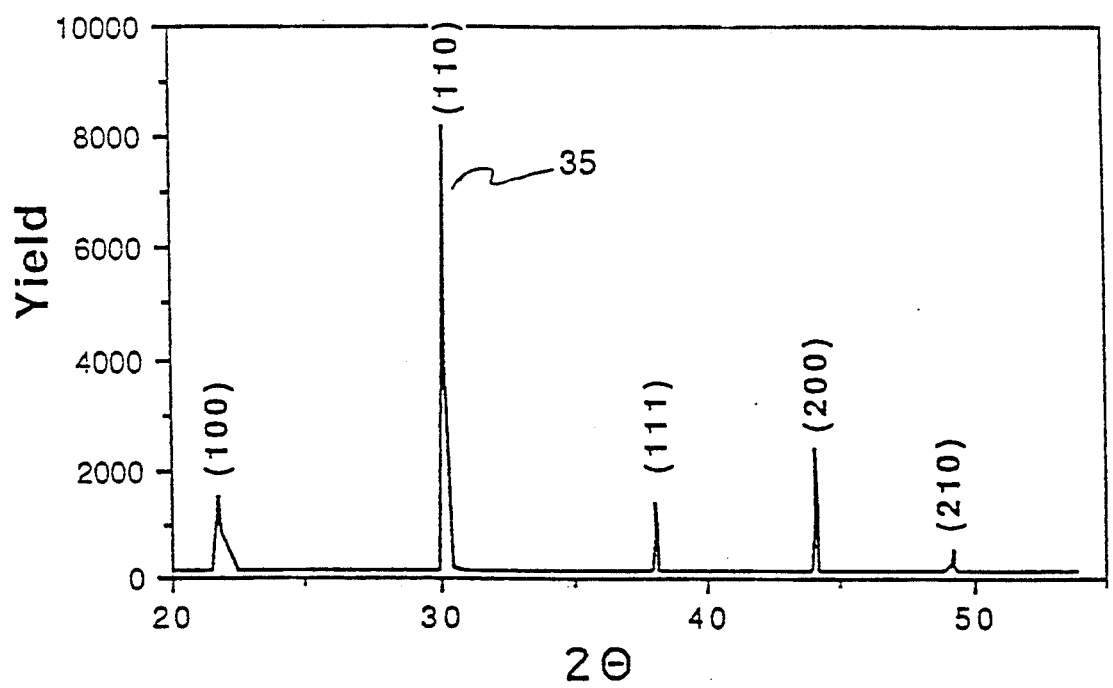
FIG. 4 is a diagrammatic illustration of an x-ray diffraction spectrum of the crystallographic structure and composition of a PLZT target (source) used in the apparatus of FIG. 3.
Figure 5B:
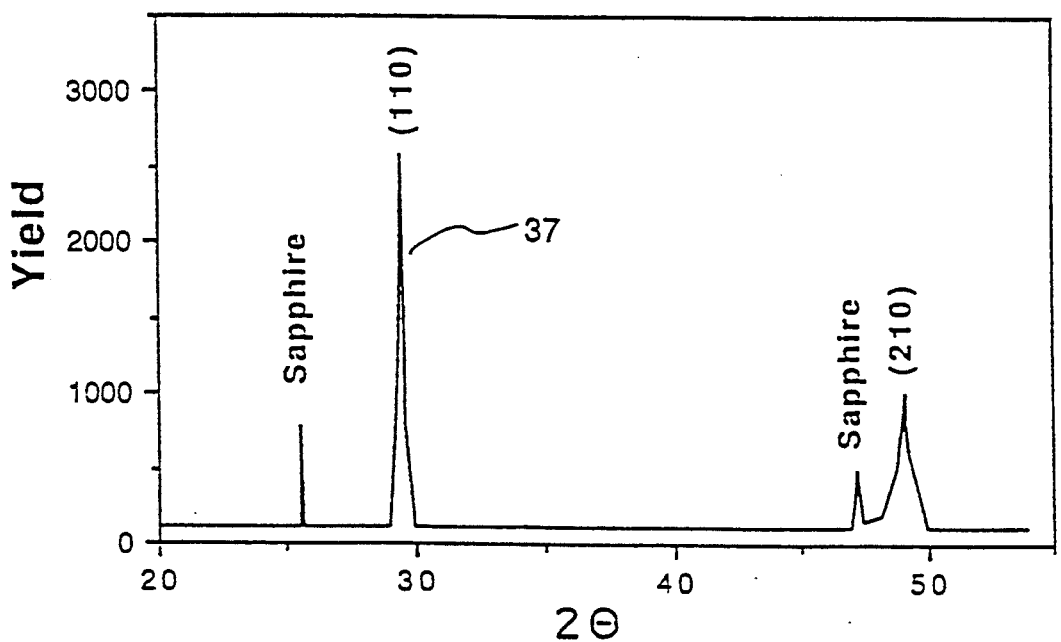

Post-deposition annealing of the component is performed to transform the film of the component from pyrochloric phase to perovskite phase. This annealing is accomplished using a conventional annealing furnace 21 (FIG. 1) by placing the component in an oxygen atmosphere (e.g., at a pressure of 100 K Pa) in the furnace at a temperature of, for example, 600° C., for a predetermined period of time (e.g., from about 20 to 60 minutes). The annealing operation improved the electro-optic property of the deposited film by transforming pyrochloric phase characteristics of the film to perovskite phase characteristics. As can be seen from the x-ray diffraction spectra shown in FIG. 5A, the grown (deposited) film has a crystalline structure with a dominant (110) orientation 37 and pyrochloric peak 33, matching the dominant orientation 35 of the target (FIG. 4). After annealing, the film is transformed from pyrochloric phase 13 (FIG. 1) to perovskite phase 41, as evidenced by the disappearance of the pyrochloric peak 33 in FIG. 5B. Following annealing, the SiO$_2$ layer may be etched away by conventional plasma (CF4) etching method, forming a component 42 as shown in FIG. 1.

Figure 6:
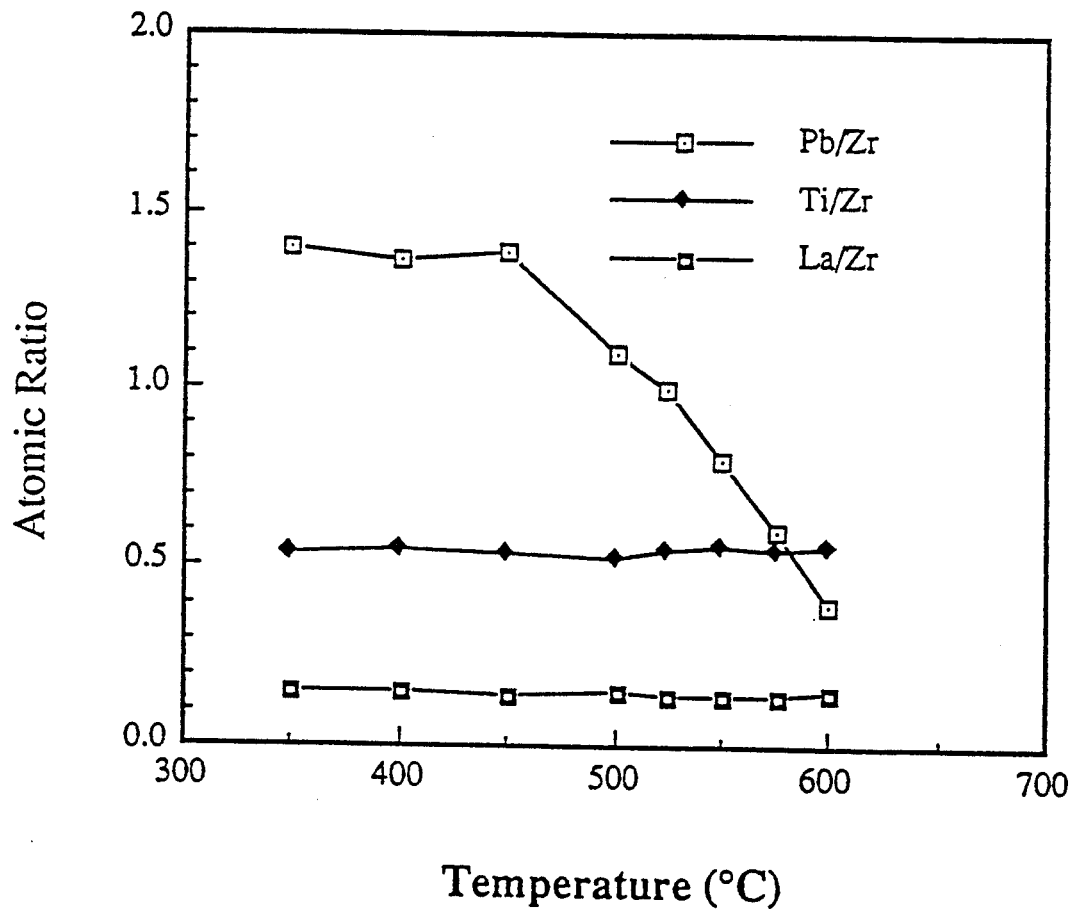
FIG. 6 is a graph showing the rapid loss of lead from the film when the deposition temperature is raised beyond 550° C.

It should be noted that if a temperature higher than 550° C. were used initially to achieve a perovskite phase during deposition of the film, this would have caused uncompensatable depletion of lead, as shown in FIG. 6. This figure shows a plot of the film composition as a function of deposition temperature. As can be seen from the figure, there is a rapid loss of lead from the film when the deposition temperature is raised beyond 550° C.

Upon examination of the component, film thickness was found to be in the range from 0.3 to 0.8 μm, the refractive index (measured at 632 nm) was in the range of 2.2 to 2.5, and the quadratic electro-optic coefficient (R) of the film was determined to be $0.6 \times 10^{-16} m^2/V^2$, as described below.

To determine the electrical and electro-optic properties of the film, aluminum was deposited by thermal evaporation, and patterned using standard photolithography, to form an interdigitated electrode structure (IDE) of varying finger widths ranging from 15 to 40 μm and electrode center-to-center spacing of 55 μm. The dielectric constant of the film $\epsilon_f$ was estimated from measurement of the capacitance of the IDE using the following equation:

$$C = K\, n\, l(\epsilon_s + 1) + (\epsilon_f - \epsilon_s[1 - exp(-4.6t/L)]$$

where $\epsilon_s$ is the dielectric constant of the substrate, t is the film thickness, L is the center-to-center spacing between adjacent fingers of the IDE, n is the number of fingers in the IDE, l is the finger length of the IDE, and K is the constant given by the structure of the IDE.

Figure 7:
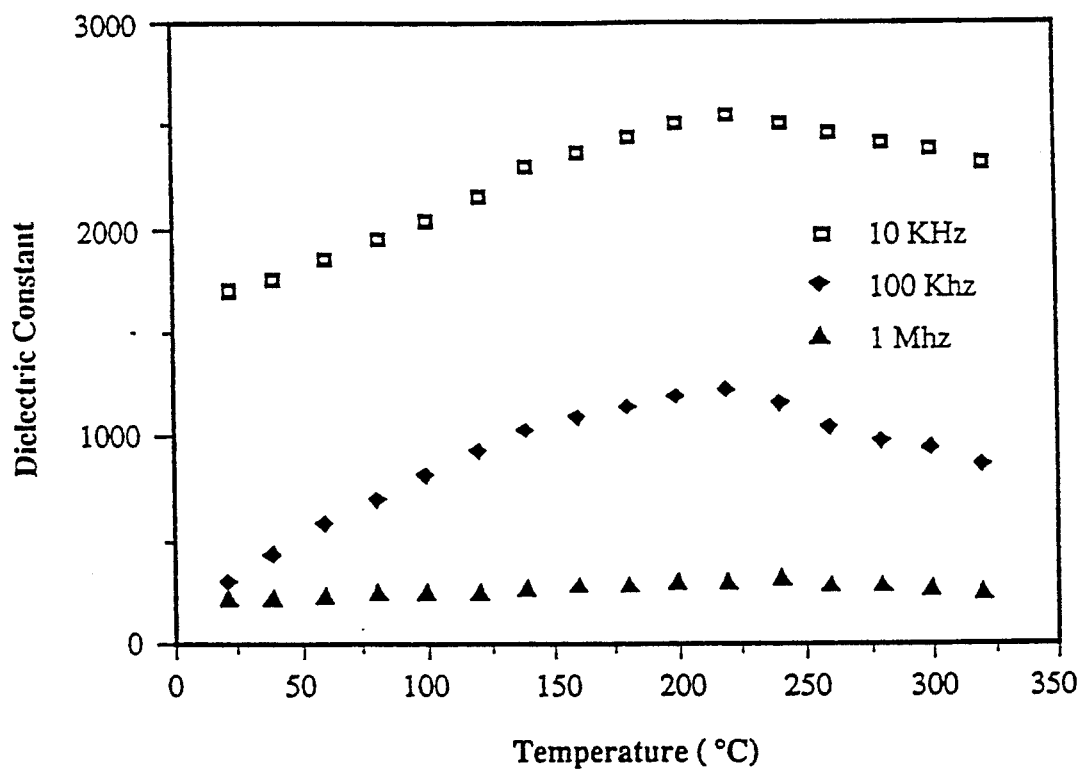
FIG. 7 is a graph showing the dielectric constant of the deposited film as a function of temperature for selected frequencies.

Using this method, the dielectric constant of the perovskite film was estimated to be in the range 1500-2500 (at frequency of 10 Khz), whereas the deposited pyrochloric films had a dielectric constant in the range 10-100. The dielectric constant tends to decrease at higher frequencies. A plot of the dielectric constant as a function of temperature of the deposited PLZT film, for frequencies of 10 Khz, 100 Khz and 1 Mhz, is shown in FIG. 7.

To measure the electro-optic coefficient of the film, coherent light at a wavelength of 514 nm, and polarized 45° C. with respect to the electric field applied on the sample, was incident on the film. The output intensity from a crossed analyzer was detected. This intensity was found to be proportional to the change in refractive index δn caused by the applied field, as follows:

$$\delta n = -\tfrac{1}{2} n^3 R E^2$$

where

R is the quadratic electro-optic coefficient of the film, n is the refractive index of the film, and E is the electric field applied on the film.

Figure 8:
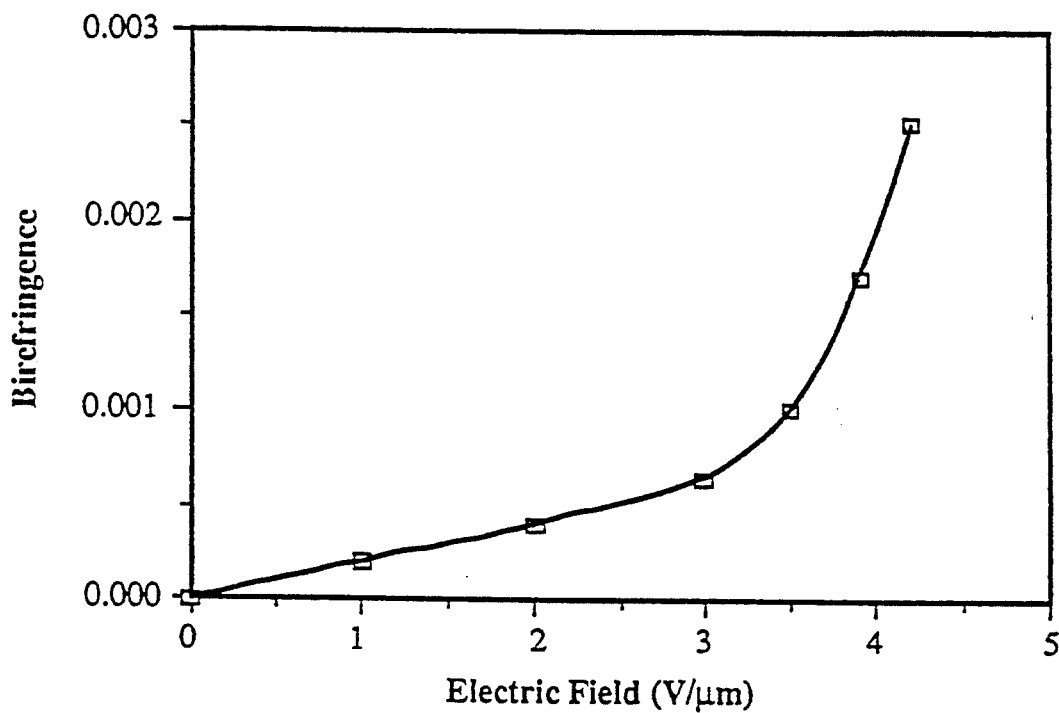
FIG. 8 is a graph showing the index of refraction (change in birefringence) of the deposited film as a function of an applied electric field.

A plot of change in birefringence (the index of refraction) as a function of applied electric field is shown in FIG. 8. The electro-optic coefficient was calculated to be $0.6 \times 10^{-16} m^2/V^2$.

While the present invention is susceptible of embodiment in various forms, there is shown in the drawings and described in the specification a presently preferred embodiment, with the understanding that the present disclosure is to be considered as an exemplification of the invention, and is not intended to limit the invention to the specific embodiment illustrated.

What is claimed is:

1. A method of producing an electro-optic circuit component, the method comprising the steps of:

providing a substrate;

providing an electro-optic material for deposition on the substrate, the material having a predetermined composition of elements;

depositing the material as a paraelectric film on the substrate at a first temperature suitable to minimize diffusion of elements from the film while accruing such a deposition as will support a strong electro-optic effect, the film and substrate forming a circuit component;

annealing the component at a higher, second, temperature in order to transform the paraelectric film into a transparent, ferroelectric film.

2. The method of claim 1, where the substrate is a sapphire substrate.

3. The method of claim 1, where the electro-optic material is PLZT having a composition of elements: lead, lanthanum, zirconate, and titanate, the transparent ferroelectric phase of the material being perovskite, and the non-transparent paraelectric phase being pyrochloric.

4. The method of claim 1 where the predetermined temperature is any temperature in the range from 400° C. to 500° C. for minimizing diffusion of the element lead, and the higher temperature is any temperature in the range from 500° C. to 700° C.

5. The method of claim 1 where the annealing transpires for a period of time in the range from 20 minutes to 60 minutes.

6. The method of claim 2, where the sapphire substrate is an R-plane (1102) sapphire substrate.

7. A method of producing an electro-optic circuit component, the method comprising the steps of:

providing a substrate;

providing an electro-optic material for deposition on the substrate, the material having a predetermined composition of elements;

depositing the material as a paraelectric film on the substrate at a first temperature suitable to minimize diffusion of elements from the film, the film and substrate forming a circuit component;

depositing an insulating layer on the film for controlling diffusion of one or more of the elements during annealing; and annealing the component at a higher, second, temperature in order to transform the paraelectric film into a transparent, ferroelectric film.

8. A method of producing an electro-optic circuit component, the method comprising the steps of:

providing a substrate;

providing an electro-optic material for deposition on the substrate, the material having a predetermined composition of elements;

depositing the material as a paraelectric film on the substrate at a first temperature below 500° C. for minimizing diffusion of the element lead from the film, the film and substrate forming a circuit component; and annealing the component at a higher, second, temperature above 500° C. in order to transform the paraelectric film into a transparent, ferroelectric film.

9. The method of claim 8 where the insulating layer is a silicon dioxide layer.

10. A method of producing a circuit component having an electro-optic PLZT film of perovskite composition on a sapphire substrate, the method comprising the steps of:

maintaining the substrate at a selected first temperature;

depositing the PLZT film on the substrate at the first temperature, said first temperature being suitably low to minimize lead diffusion from the film, to produce a pyrochloric film, the pyrochloric film and substrate forming a circuit component; then annealing the component at a selected second temperature for a period of time, said second temperature being higher than the first temperature, for transforming the pyrochloric film to a substantially transparent, ferroelectric film with perovskite composition and without substantial lead diffusion.

11. The method of claim 10 including an additional step of capping the component before annealing by depositing a silicon dioxide layer over the deposited pyrochloric film before annealing in order to prevent lead diffusion from the film during annealing.

12. A method of producing film of a perovskite phase of a composition of elements lead, lanthanum, zirconate and titanate on a substrate, the method comprising:

depositing a film of a composition of elements lead, lanthanum, zirconate and titanate in their pyrochloric phase on a substrate; and annealing the pyrochloric-phase film to change it to the perovskite phase.

13. The method according to claim 12 which, as a step prior to the annealing, further comprises:

depositing upon the pyrochloric phase film a covering film that is resistant to the diffusion of lead.

14. The method according to claim 12 wherein the depositing transpires at a temperature less than 550° Centigrade and the annealing transpires at a temperature greater than 550 Centigrade.

15. A method of producing transparent electro-optic film of a perovskite phase of a composition of elements lead, lanthanum, zirconate and titanate on a R-plane sapphire substrate, the method comprising:

epitaxially growing a film of a composition of elements lead, lanthanum, zirconate and titanate in their pyrochloric phase on an R-plane sapphire substrate at a temperature less than 500° Centigrade to produce a non-ferroelectric pyrochloric film; and annealing the non-ferroelectric pyrochloric film at a temperature greater than 550° Centigrade to transform it into a ferroelectric perovskite film of (9/65/35) composition.

16. The method according to claim 15 which, as a step prior to the annealing, further comprises:

depositing a covering film of silicon dioxide upon the pyrochloric phase film which silicon dioxide film is resistant to the diffusion of lead from the pyrochloric phase film during the annealing.

* * * * *